United States Patent [19]
Gollinger

[11] 3,945,194
[45] Mar. 23, 1976

[54] ELECTRONIC QUARTZ CLOCK WITH INTEGRATED CIRCUITS

[75] Inventor: Wolfgang Gollinger, Gundelfingen, Germany

[73] Assignee: ITT Industries, Inc., New York, N.Y.

[22] Filed: Dec. 5, 1974

[21] Appl. No.: 529,772

[30] Foreign Application Priority Data
Dec. 15, 1973  Germany............................ 2362470

[52] U.S. Cl................ 58/23 R; 307/222 C; 328/14
[51] Int. Cl.² G04C 3/00; H03K 29/00; H03B 19/12
[58] Field of Search...................... 58/23 R; 328/14; 307/222 C

[56] References Cited
UNITED STATES PATENTS
3,777,471  12/1973  Koehler et al. .................... 58/23 R

*Primary Examiner*—Edith Simmons Jackmon
*Attorney, Agent, or Firm*—John T. O'Halloran; Menotti J. Lombardi, Jr.; Vincent Ingrassia

[57] ABSTRACT

This relates to a quartz clock having a frequency divider IC with an adjustable and programmable dividing factor. The adjustable dividing factor is reached by suppression of the pulses to be divided in such a manner that the distribution of the suppressed pulses is optimized.

2 Claims, 3 Drawing Figures

ELECTRONIC QUARTZ CLOCK WITH INTEGRATED CIRCUITS

BACKGROUND OF THE INVENTION

This invention relates to a quartz clock having a frequency divider integrated circuit with an adjustable and programmable dividing factor and more particularly to the problem of replacing, in electronic quartz clocks with integrated circuits containing a crystal oscillator and an asynchronous frequency divider, the series trimmer for frequency fine adjustment by making the division ratio between crystal-oscillator frequency and frequency-divider-output frequency adjustable in steps within predetermined limits. The integrated circuits of such quartz clocks are preferably complementary insulated-gate field-effect-transistor circuits, i.e., so-called C-MOS circuits.

Several proposals have been made to solve this problem, as disclosed in German Published applications Nos. 1,946,166, 2,211,441, 2,219,493, 2,233,800, 2,241,514 and 2,250,389 as well as Swiss Pat. No. 534,913. It is a common feature of all solutions of the known prior art except of the first one that the normally m-stage frequency divider must have additional divider stages which, together with a programmable memory circuit and a comparision circuit, influence the m stages of the frequency divider as desired.

In the known prior art this is done in various ways. In the arrrangement disclosed in German Published application No. 2,241,514, for example, the oscillator frequency is chosen to be always lower than the frequency divider's input frequency corresponding to an $m$-stage binary frequency division, and additional pulses are added at the output or at individual stages of the frequency divider so that the frequency divider's output frequency equals the divided nominal frequency.

In another known solution, namely that disclosed in German Published application No. 2,233,800, the actual oscillator frequency is also chosen to be lower than the nominal frequency, and by intermittently short-circuiting individual frequency-divider stages, the frequency divider is caused to count faster and, thus, the output frequency is approximated to the divided nominal frequency. The duration of the short circuit of individual frequency divider stages is determined by an additional counter, i.e., again by additional frequency-divider stages.

Arrangements disclosed in the other German Published applications mentioned above (except German Published application No. 1,946,166) also influence individual frequency-divider stages in response to signals from comparison or memory circuits by cutting off individual divider stages during certain counting times, which comparison or memory circuits, in turn, are controlled by additional frequency divider stages.

As the aforementioned known solutions to the problem described require at least additional divider stages and other additional circuits large additional circuitry must be provided which, in principle, is monolithically integrable but increases energy consumption to such an extent that such circuits are disadvantageous, particularly for wristwatches.

The above-mentioned German Published application no 1,946,166 discloses another solution to the known no. which requires only one m-stage frequency divider as is used in oscillator circuits with a series trimmer. In that arrangement, the actual oscillator frequency must be higher than the nominal frequency, and at the input of the frequency divider or of a frequency-divider stage near the input, pulses are suppressed intermittently by means of a blanking circuit, with the blanking time being determined by the pulse duration of the output signal of a monostable or bistable multivibrator to which the output signal of the frequency divider is fed as the input signal.

That multivibrator is designed so that the duration of the output pulses can be adjusted from outside by means of an adjustable resistor. Furthermore, the multivibrator is proportioned so as to be able to compensate for changes in oscillator frequency which are due to aging and temperature variations.

It is obvious that the accuracy of this known solution depends on the accuracy of the duration of the multivibrator's output pulses. However, since this multivibrator can be realized only with components having the usual tolerances if the expense is to be kept within reasonable limits, the blanking time is both temperature, age, and supply-voltage-dependent. Furthermore, accuracy is dependent on the accuracy of adjustment of the external adjusting element, which may be an adjustable resistor, for example, so that another factor of uncertainty is created.

Finally, in this known arrangement, the input pulses and the output pulses of the frequency divider are in phase only if the frequency divider is a synchronous counting circuit, while no such phase relationship exists when asynchronous counters are used as frequency dividers. The latter case is generally preferred for frequency dividers in clocks.

SUMMARY OF THE INVENTION

It is an object of the present invention to eliminate the disadvantages of the last referred to known arrangement. In particular, the anologous influence on the pulse duration of the multivibrator is to be replaced by an arrangement which permits digital, and thus more accurate, adjustment. Furthermore, in the case of asynchronous frequency-divider circuits, the locked phase relation between input pulses and blanking pulses is to be established.

According to a broad aspect of the invention, there is provided an electronic quartz clock wherein there is provided a frequency divider integrated circuit having an adjustable and programmable dividing factor comprising: a source of negative voltage; a crystal oscillator; an asynchronous frequency divider having a predetermined number of stages; a blanking circuit coupled between a first predetermined number of divider stages and a second predetermined number of divider stages; an electronic switch coupled between said second predetermined number of stages and a third predetermined number of stages such that a portion of said second predetermined number of stages can be cut out of said frequency divider; an adjustment circuit for generating a number of control signals, said number being equal to said third predetermined number; and multiple gate logic means having as inputs said control signals and the outputs of said third predetermined number of stages, said logic means having an output coupled to said blanking circuit for suppressing a number of pulses generated by said oscillator in an evenly distributed manner.

The above and other objects of the present invention will be more clearly understood from the following detailed description taken in conjunction with the ac-

DESCRIPTION OF THE PREFERRED EMBODIMENT

Figure 1:
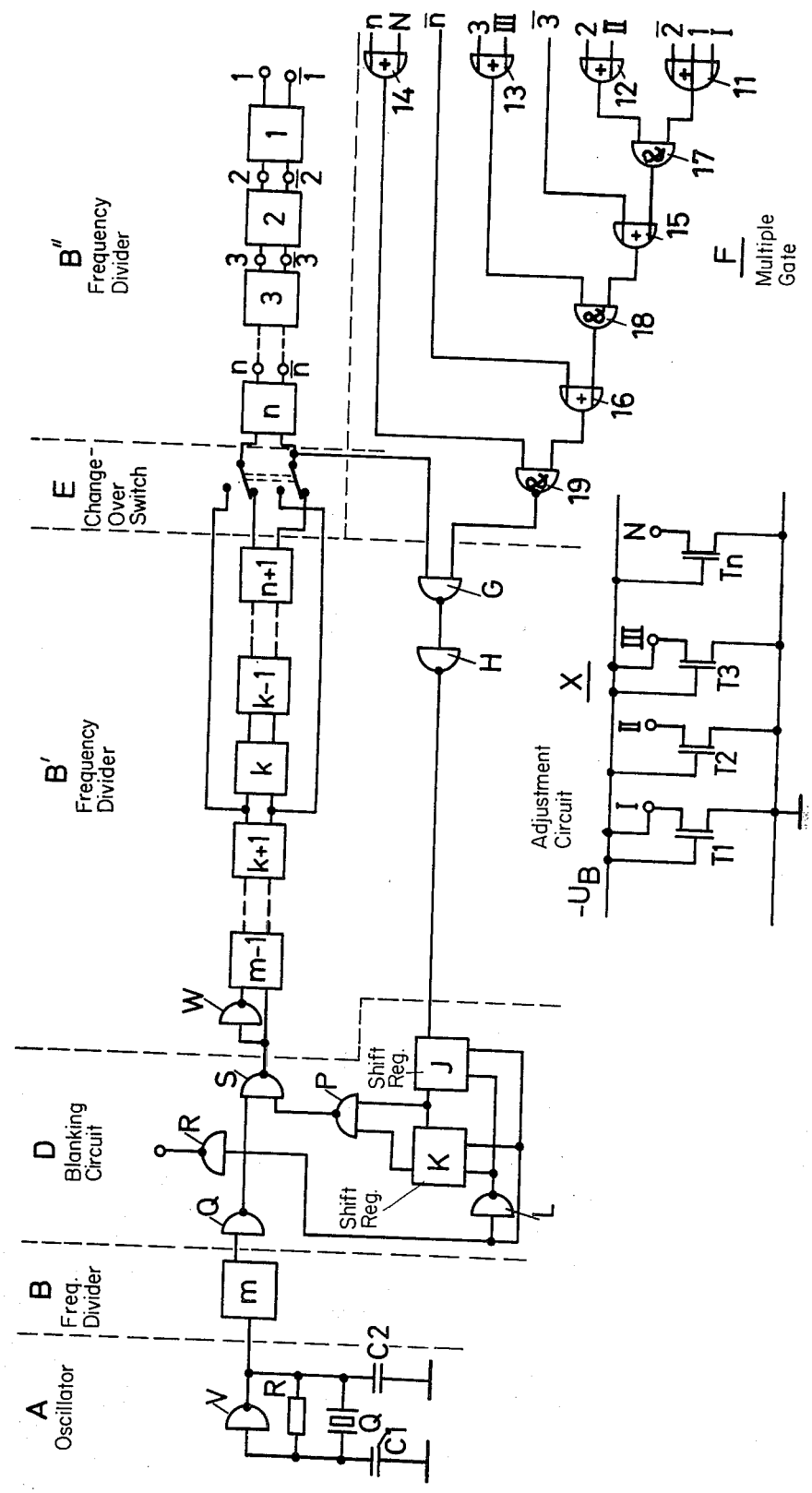
FIG. 1 is a block diagram showing an embodiment of the invention.

The embodiment of FIG. 1 consists of the oscillator circuit A, the $m$-stage frequency divider B, B', B'', the blanking circuit D, the changeover switch E, the multiple gate F, the adjustment circuit X, and the AND gate G, H. The crystal-oscillator circuit A consists, in known manner, of the inverter V, between whose input and output the resistor R and the crystal Q are connected in parallel, with input and output grounded via the capacitors C1 and C2, respectively.

The $m$-stage frequency divider consists of the stage $m$ ahead of the blanking circuit D, the stages $m-1$ to $n+1$ between the blanking stage D and the changeover switch E, and the stages $n$ to 1 following the changeover switch E. The two latter frequency-divider sections are designated B' and B''.

The frequency-divider stage $m$ is driven directly from the output of the crystal-oscillator circuit. The input of the frequency-divider stage $m-1$ and the inputs of the other frequency-divider stages are driven after the manner of an asynchronous counter, i.e., the input of a following stage is driven directly from the output of a preceding stage. Since the above-mentioned C-MOS circuits are clock-pulse-operated circuits which mostly use two clock pulses which are square waves and shifted with respect to each other by one-half period, the frequency-divider stage $m-1$ is driven both directly from the output of the blanking circuit D and via the inverter W so that the two aforementioned clock signals are obtained.

The blanking circuit D, which, in the embodiment of FIG. 1, is effective between the stages $m$ and $m-1$, essentially comprises a two-stage synchronous shift register with the stages J, K, an inverter L, which generates the two out-of-phase clock signals of the synchronous shift register in the same manner as the inverter W, the NAND gates P, S, and the inverters Q, R. The blanking circuit may also be effective ahead of the stage $m$ or of any one of the other frequency-divider stages near the input.

The multiple gate F connects the outputs of the n last frequency-divider stages with the same number of stages of the adjustment circuit X. The logic equation of the multiple gate $F$ is:

$$\overline{F} = [[<\{[(I+1+\overline{2})\&(II+2)]\ \overline{+3}\}\&\ (III+3)> \ldots\ +\overline{n}]]\ \&\ (N+n)$$

In this equation, the sign + denotes the inclusive OR and the sign & the logic AND. The multiple gate consists of the OR gates 11, 12, 13, 14, 15 and 16 and of the AND gates 17, 18, 19. From the above equation and the circuit diagram, the logic equation underlying the multiple gate easily follows so that it is also possible to interconnect more than four stages in analogous manner. As can be seen from the drawing and the logic equation, the output of the frequency-divider stages 1 to $n$ and the respective stages I to N of the adjustment circuit X are interconnected, as stated above, by means of the above-mentioned AND and OR gates. Thus, during a counter cycle, i.e. during $2^m$ pulses, $2^{n-1}$ pulses can be blanked. The inputs I to N of the multiple gate F are weighted in the binary code, so that each number between 0 and $2^{n-1}$ can be adjusted. Also, the output signal of the frequency divider behind the stage 1 exhibits no jitter, while, if the divided output frequency is taken off a stage ahead of the stage 1, the multiple gate F insures that the blanked pulses are distributed as evenly as possible among the total number of pulses $2^m$.

By means of the changeover switch E, which, for clarity, is shown in FIG. 1 as a mechanically operable switch, but is, of course, an electronic switch, the stages $k$ to $n+1$ can be taken out of the frequency divider. This has the advantage that during adjustment of the frequency-divider circuit in combination with its corresponding oscillator circuit, a considerably shorter measure time is needed because the output frequency of the frequency divider is only $2^{m-k}$ times lower than the oscillator frequency, the output frequency thus being $k$ times higher than the output frequency of the entire frequency divider. This does not, however, result in a loss of accuracy.

With the aid of the synchronous shift register J, K the blanking circuit D is designed so that a fixed phase relation exists between the output pulses of the frequency-divider stage $m$ and the blanking pulses. The output frequency of the frequency-divider stage m serves as the clock frequency for the synchronous shift register J, K. Via the AND circuit G, H, which consists of the NAND circuit G and the inverter H, the synchronous shift register J, K receives input pulses from the multiple gate F only if a signal is applied to the inverting input of the frequency-divider stage $n$, with the positive-going pulse edges being the controlling edges. Thus, any undesireable spikes at the output of the gate F, which may be caused by delays in the $n$ last divider stages, are rendered ineffective.

The adjustment circuit X contains one $n$-channel transistor for each value to be adjusted, namely the transistors T1, T2, T3 and Tn. Depending on whether the drain electrode is not wired or connected to the negative terminal of the supply voltage source $U_B$, a logic ONE or a logic ZERO is applied to the multiple gate F. If the drain electrode is connected to the negative terminal of the supply-voltage source $U_B$ as in the case of the transistors T1 and T3, a logic ZERO is applied to the multiple gate, while, if the drain electrode is not wired as in the case of the transistors T2 and Tn, a logic ONE is applied to the multiple gate.

Figure 2:
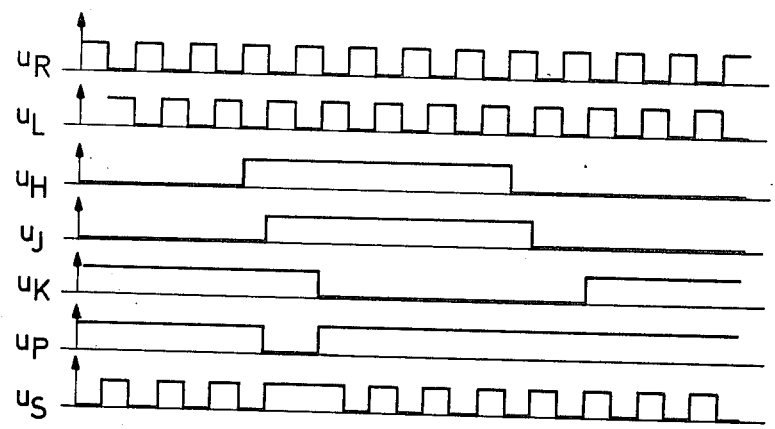
FIG. 2 shows the pulse diagram of the blanking circuit of FIG. 1.

FIG. 2 shows the pulse diagram of the blanking circuit D; the waveforms shown are the output voltages of the gates specified in the subscript of the respective voltage. The voltages $u_R$, $u_L$ form the clock signals for the synchronous shift register J, K, which, as mentioned hereinbefore, are 180° out of phase and square waves. The output voltage $u_H$ of the inverter H serves as input voltage of the shift register. The voltage $u_J$ is developed at the output of the first shiftregister stage J, and the voltage $u_K$ appears at the inverting output of the second shift-register stage. From these two voltages the voltage $u_P$ is obtained at the output of the NAND circuit P; it must have the waveform shown because two pulses shifted by one clock period of the clock signals $u_R$, $u_L$ are processed in the NAND circuit P. Thus, the voltage $u_S$ appears at the output of the NAND gate S, which voltage contains, between the pulses with the clock frequency, a pulse of one and a half times the clock period, during which time a clock pulse is thus blanked. The inverter W generates from the voltage $u_S$ the second, inverted clock signal for the stage $m-1$.

It can be seen that by the choice and wiring of the synchronous shift-register stages J, K and of the NAND circuit P, a pulse is suppressed only whenever the output signal of the inverter H has a leading pulse edge, while the length of this pulse is insignificant. Thus, the equidistribution of the pulses to be blanked is optimized.

Figure 3:
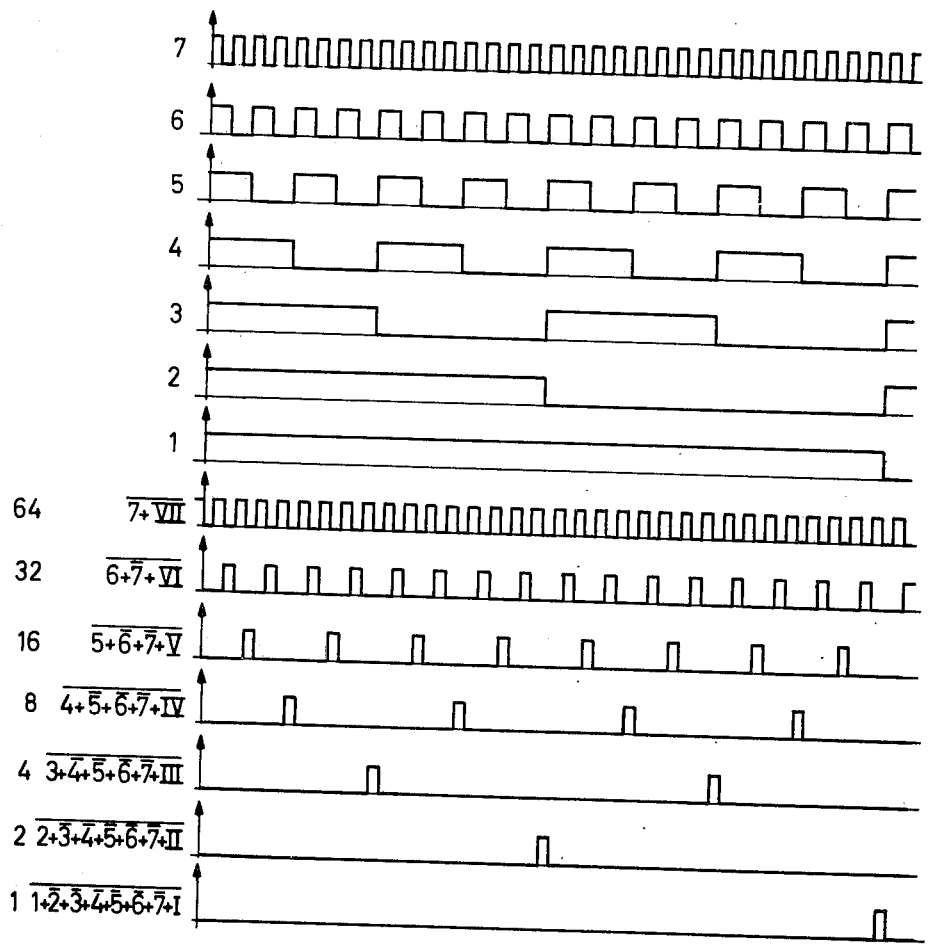
FIG. 3 shows the pulse diagram of the last frequency-divider stages and of the multiple gate of FIG. 1.

FIG. 3 shows the pulse diagram of the $n$ last outputs of the frequency divider (upper half of FIG. 3) and the pulse diagram of the output of the multiple gate F (lower half of FIG. 3). In this example it is assumed that there are seven last frequency-divider stages and seven inputs of the adjustment circuit X, i.e., both $n$ and N are equal to seven.

As can be seen, the pulse diagram of the upper half of FIG. 3 is that of a binary frequency divider. By contrast, the lower half of FIG. 3 shows the pulse diagrams which are obtained if the individual adjusting inputs of the adjustment circuit X are activated. For example, if the adjusting input V is activated, the pulse train designated 16 is obtained, i.e., 16 blanking pulses are obtained during each complete frequency-divider cycle. Analogously, if the other inputs are activated, 1, 2, 4, 8, 32 or 64 blanking pulses are obtained. If several adjusting inputs are activated simultaneously, the sum of the blanking pulses allotted to them is obtained.

The logic equation beside the number of pulses blanked shows in detailed form the interconnection of the frequency-divider outputs and of the adjusting inputs, which can be reduced by simplification to the above logic interconnection of the multiple gate F.

The arrangement according to the invention thus permits the component-tolerance-, temperature- and battery-voltage- dependent properties of the multivibrator provided in German Published application no. 1,946,166 to be eliminated and allows safe adjustment of the frequency divider's output frequency.

The adjustment of the frequency divider's output frequency to the nominal value can be effected as follows. First, the actual input frequency of the the adjustable part is measured at the output of the inverter stage R of the blanking circuit D; from the difference from the nominal frequency those inputs of the adjustment circuit X are then determined in binary-coded fashion which must be activated to obtain the correct output frequency. These inputs, which may first be internally connected to ground via the transistors T1 to Tn, for example, are then connected to the negative supply voltage by a suitable contacting technique, i.e., by soldering or thermocompression bonding. The same adjustment may, of course, also be effected by opening some of the previously existing permanent connections to the negative supply voltage, e.g., by stamping, sandblasting or by means of a laser beam. This manner of adjustment insures that the adjustment once effected remains unchanged during the operation of the quartz clock, which is not necessarily the case with the arrangement disclosed in the aforementioned German published application, because adjustments of variable resistors may be changed through heavy shocks, as is well known.

The gates used may, of course, be replaced by the gates complementary thereto without departing from the scope of the invention. In that case, the respective complementary input signals must be used. This applies in particular to the multiple gate F of FIG. 1.

While the principles of the invention have been described above in connection with specific apparatus, it is to be clearly understood that this description is made only by way of example and not as a limitation on the scope of the invention.

What is claimed is:

1. In an electronic quartz clock, a frequency divider integrated circuit having an adjustable and programmable dividing factor comprising:
    means for providing a negative voltage;
    a crystal oscillator;
    an asynchronous frequency divider having a predetermined number of stages;
    a blanking circuit coupled between a first predetermined number of divider stages and a second predetermined number of divider stages;
    a switch coupled between said second predetermined number of stages and a third predetermined number of stages such that a portion of said second predetermined number of stages can be cut out of said frequency divider;
    an adjustment circuit for generating a number of control signals, said number being equal to said third predetermined number; and
    multiple gate logic means having as inputs said control signals and the outputs of said third predetermined number of stages, said logic means having an output coupled to said blanking circuit for suppressing a number of pulses generated by said oscillator in an evenly distributed manner.

2. A frequency divider according to claim 1 wherein said adjustment circuit contains for each input of said multiple gate logic means a transistor having a source coupled to ground, a gate coupled to said means for providing, and a drain coupled to a corresponding adjusting input.

* * * * *